US010326254B2

(12) United States Patent
Sorg

(10) Patent No.: US 10,326,254 B2
(45) Date of Patent: Jun. 18, 2019

(54) LASER ACTIVATED REMOTE PHOSPHOR SYSTEM AND VEHICLE HEADLIGHTS

(71) Applicant: OSRAM GmbH, Munich (DE)

(72) Inventor: Joerg Sorg, Regensburg (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 15/791,431

(22) Filed: Oct. 24, 2017

(65) Prior Publication Data

US 2018/0115137 A1   Apr. 26, 2018

(30) Foreign Application Priority Data

Oct. 25, 2016   (DE) .................. 10 2016 220 917

(51) Int. Cl.
| | |
|---|---|
| *H01S 3/00* | (2006.01) |
| *H01S 5/00* | (2006.01) |
| *H01S 5/323* | (2006.01) |
| *H01S 5/40* | (2006.01) |
| *F21S 41/16* | (2018.01) |
| *F21S 41/14* | (2018.01) |
| *G03B 21/20* | (2006.01) |

(52) U.S. Cl.
CPC ............ *H01S 5/0092* (2013.01); *F21S 41/16* (2018.01); *H01S 5/00* (2013.01); *H01S 5/0071* (2013.01); *H01S 5/32341* (2013.01); *H01S 5/4093* (2013.01); *F21S 41/14* (2018.01); *G03B 21/204* (2013.01)

(58) Field of Classification Search
CPC .... H01S 5/0092; H01S 5/4093; H01S 5/0071; H01S 5/32341; F21S 41/14; G03B 21/204
See application file for complete search history.

(56) References Cited

U.S. PATENT DOCUMENTS

| | | | |
|---|---|---|---|
| 2014/0022760 A1* | 1/2014 | Hartwig | G03B 21/204 362/84 |
| 2014/0369064 A1 | 12/2014 | Sakaue et al. | |
| 2015/0034987 A1* | 2/2015 | Hayashi | H01L 33/60 257/98 |
| 2016/0238203 A1 | 8/2016 | Lenef et al. | |

FOREIGN PATENT DOCUMENTS

| | | |
|---|---|---|
| DE | 102014221115 A1 | 4/2016 |
| JP | 2013102078 A | 5/2013 |
| WO | 2012128384 A1 | 9/2012 |
| WO | 2016058816 A1 | 4/2016 |

OTHER PUBLICATIONS

English Translation of WO2012/128384.*
European Search Report based on application No. 17192426.9 (8 pages) dated Feb. 15, 2018.
German Search Report based on application No. 10 2016 220 917.5 (8 pages) dated Apr. 18, 2017.
European Office Action based on application No. 17 192 426.9 (6 pages) dated Dec. 7, 2018.

* cited by examiner

*Primary Examiner* — Yuanda Zhang
(74) *Attorney, Agent, or Firm* — Viering, Jentschura & Partner MBB

(57) ABSTRACT

A laser activated remote phosphor system may include a radiation source configured to emit excitation radiation and a conversion element which has a phosphor and is able to be irradiated by the excitation radiation. An input coupling surface of the conversion element has a delimitation line beyond which a central excitation spot of the excitation radiation radiates at least in sections.

18 Claims, 1 Drawing Sheet

LASER ACTIVATED REMOTE PHOSPHOR SYSTEM AND VEHICLE HEADLIGHTS

CROSS-REFERENCE TO RELATED APPLICATION

This application claims priority to German Patent Application Serial No. 10 2016 220 917.5, which was filed Oct. 25, 2016, and is incorporated herein by reference in its entirety.

TECHNICAL FIELD

Various embodiments relate generally to a laser activated remote phosphor (LARP) system and to a vehicle headlight.

BACKGROUND

In LARP systems, a conversion element, which includes or consists of a phosphor and is arranged at a distance from a radiation source, is irradiated with excitation radiation, in particular an excitation beam (pump beam, pump laser beam), in particular with the excitation beam from a laser diode. The excitation radiation of the excitation beam is at least partially absorbed by the phosphor and at least partially converted into conversion radiation, the wavelengths of which, and thus the spectral properties and/or color, is determined by the conversion properties of the phosphor. By way of example, it is possible in this manner by way of the conversion element to convert blue excitation radiation (blue laser light) into red and/or green and/or yellow conversion radiation (conversion light). A system such as this is also referred to as a laser activated remote phosphor (LARP) system.

Conversion light and any unconverted excitation light together form the used light. If, for example, a blue laser diode having an excitation radiation in the wavelength range of approximately 440 to 470 nm and a conversion element, which for example consists of cerium doped yttrium-aluminum garnet, i.e. Ce:YAG, and converts into conversion radiation in the yellow wavelength range, are used, then, as the proportion of unconverted laser radiation in conversion light decreases, bluish, white-bluish, white, white-yellowish or yellow used light is obtained. The color coordinates of the used light in the automotive field are preferably in the standardized ECE white field in accordance with the guideline ECE/324/Rev. 1/Add.47/Reg.No. 48/Rev.12.

It has been shown here that this blue-yellow color shift of the used light results in what are known as blue-yellow rings in the used light downstream of the conversion element. The central radiation is blue in excess, and the exterior radiation is yellow in excess, with the result that blue-yellow rings form on the emission side of the conversion element if the excitation radiation profile is symmetric. As a result, a blue-yellow ring problem, or color variances of the surfaces to be irradiated (road, wall), which are however undesired in vehicle headlights or in effect lighting, even occur in the provided applications.

Such LARP systems are used for example as light sources in vehicle headlights or projection applications. Suitable optical systems can be provided to focus the excitation radiation onto the conversion element.

It has been shown that a color point path, that is to say a locational dependence of the color point, exists by way of the light-exit surface of the conversion element. Moreover, a color point path can occur as viewed over the viewing angle, i.e. an angular dependence of the color point. If, for example, the LARP system is employed in a vehicle headlight, it is typically combined with optical elements, such as for example reflectors and lenses. Projection of the used light that is inhomogeneous in terms of color into an illumination region thus produces a color point path in the illumination region. The inhomogeneity of the used light in the illumination region is here undesired.

SUMMARY

A laser activated remote phosphor system may include a radiation source configured to emit excitation radiation and a conversion element which has a phosphor and is able to be irradiated by the excitation radiation. An input coupling surface of the conversion element has a delimitation line beyond which a central excitation spot of the excitation radiation radiates at least in sections.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

Figure 1:
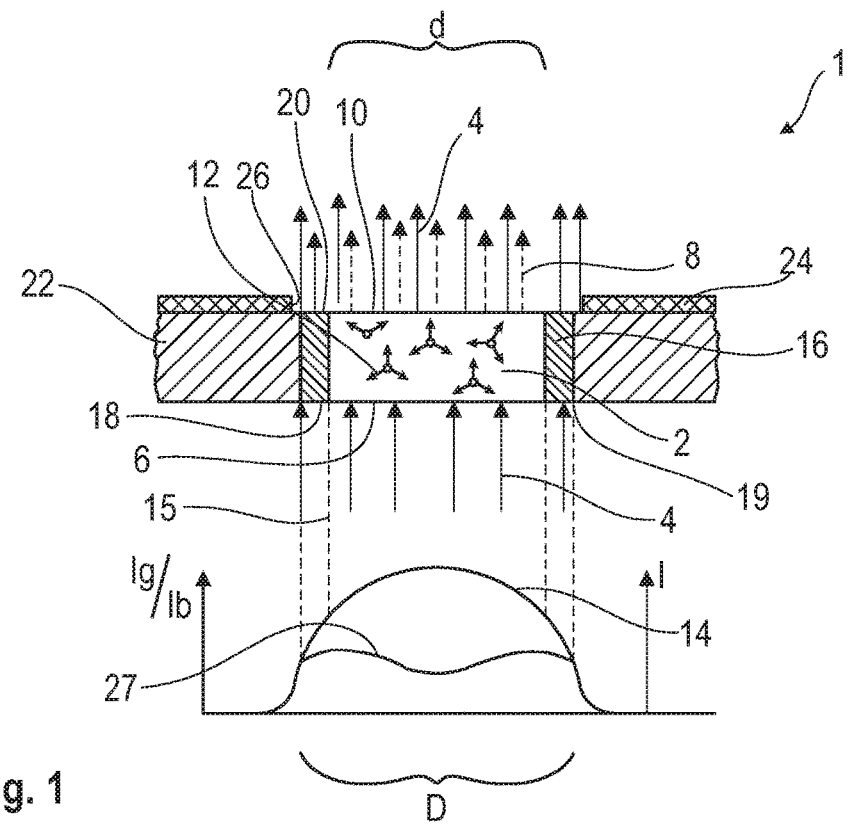
FIG. 1 shows a schematic longitudinal section of a laser activated remote phosphor (LARP) system in accordance with various embodiments.

According to FIG. 1, a LARP system 1 has a conversion element 2. The latter is able to be irradiated with excitation radiation 4 from a radiation source or a pump light source (not illustrated), which emits radiation via an input coupling surface 6 of the conversion element 2 into the latter. Some of the excitation radiation 4, which can be for example blue laser light, is partially converted by the phosphor in the conversion element 2 into conversion radiation 8. The conversion radiation 8, together with unconverted excitation radiation 4, forms used light, which exits an output coupling surface 10 of the conversion element 2. The excitation radiation 4 and the conversion radiation 8 are scattered in the conversion element 2, which is indicated by way of arrows 12.

According to FIG. 1, an intensity distribution 14 (I) of the excitation radiation 4 is shown. It is here illustrated only in one plane, wherein the intensity distribution 14 in other planes in which the main emission axis of the radiation source extends is configured with approximate correspondence. FIG. 1 thus shows a diameter D of a central excitation spot of the radiation source. The diameter D thus defines here the extent of the central excitation spot. The figure shows that the diameter D is greater than a diameter d of the conversion element 2, as a result of which homogeneity of the used light exiting the output coupling surface 10 is improved as compared to the prior art. The diameter D is here 300 μm or approximately 300 μm.

According to FIG. 1, the plate-type conversion element 2 has an external delimitation line 15 and is enclosed by an annular light-passage element 16. The latter has an approximately circle-ring-shaped cross section. A light-entry surface 18 of the light-passage element 16 is here approximately in a plane with the input coupling surface 6 and has an external delimitation line 19. Furthermore, a light-exit surface 20 of the light-passage element 16 is located approximately in a plane with the output coupling surface 10. The light-passage element 16 is configured to be transparent or partially transparent for the excitation radiation 4. As a result, the excitation radiation 4 can radiate through the light-passage element 16. This is made possible in particular by way of the central excitation spot with the diameter D having a greater diameter than the conversion element 2 and thus radiating beyond it. Owing to the excitation radiation 4 that radiates through the light-passage element 16, the used light exiting the LARP system 1 is further homogenized.

The light-passage element 16 in turn is enclosed by a confinement structure 22. The latter may be configured to be opaque for the excitation radiation 4.

Arranged on the approximately plate-shaped confinement structure 22 is, on the sides of the output coupling surface 10, a mask 24 or a stop structure having an opening 26. The opening 26 here has an identical or greater diameter than a diameter of the light-passage element 16. The mask 16 can be used in particular to confine any radiation that may be emitted by the confinement structure 22. Alternatively or additionally, it is feasible to provide such a confinement structure on the entrance side (not illustrated).

According to FIG. 1, a ratio of the intensity distribution of yellow conversion radiation (Ig) to blue, unconverted excitation radiation (Ib) is schematically illustrated on the output side of the LARP system 1, see line 27. The blue proportion is higher in the central region, and in the exterior region the yellow portion is greater. According to FIG. 2, what can be seen is that the conversion element 2, as viewed in cross section, has an approximately circular design. The light-passage element 16 is here, viewed in cross section, approximately circle-ring-shaped or circle-segment-ring-shaped. The dash-dotted line 28 here shows approximately the possible exit region of the radiation. The central excitation spot D (not illustrated) of the excitation radiation here completely sweeps over the entire surface of the conversion element 2 and at least over some of the surface of the circle-segment-ring-shaped light-passage element 16.

Figures 2, 3, 4:
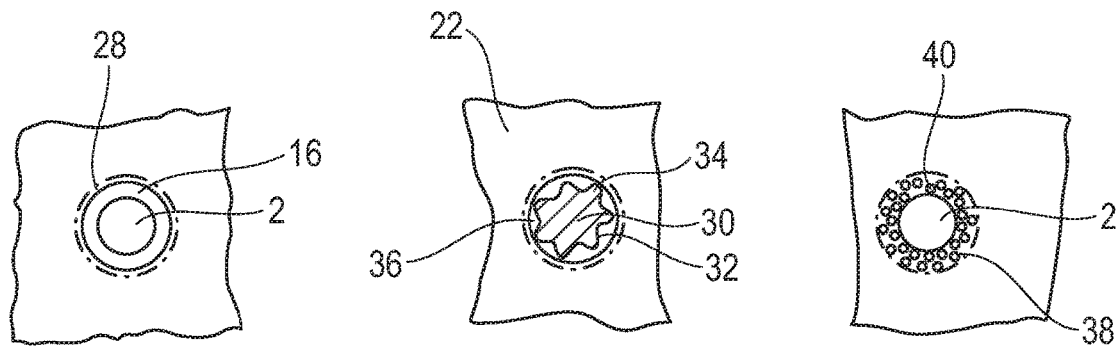
FIG. 2 shows a plan view of the LARP system of FIG. 1.
FIGS. 3 and 4 each show a plan view of a LARP system in accordance with various embodiments.

According to FIG. 3, a conversion element 30 has an approximately undulating or star-shaped outer contour 32. A conversion element of this kind can, for example, be produced by way of sintering, compression molding or punching. As a result, a phosphor amount in the edge region is reduced as compared to a circular conversion element. The conversion element 30 thus has, according to FIG. 3, jags 34 or projections at its outer perimeter or its outer lateral surface. A light-passage element 36 furthermore engages around the conversion element 30, the inner contour of said light-passage element 36 being adapted to the outer contour 32. Conversion element 30 and light-passage element 36 can here be connected for example by way of adhesion or sintering or compression. An outer contour of the light-passage element 36 is approximately circular corresponding to FIG. 1 and the confinement structure 22 engages around it. Here the central excitation spot D (not illustrated) of the excitation radiation also sweeps over the entire surface of the conversion element 30 and at least some of the surface of the light-passage element 36.

FIG. 4 shows the conversion element 2 with the approximately circular cross-sectional shape. A light-passage element 38, which has an annular or circle-ring-shaped design, engages around it. The former here consists of a material that is not transparent for the excitation radiation. However, a multiplicity of through-cutouts 40 are provided in the light-passage element 38, which through-cutouts 40 extend approximately in the direction of the excitation radiation and through which the excitation radiation can then radiate. The through-cutouts 40 can here be provided for example already during sintering of a ceramic conversion element, or by way of subsequent laser ablation. The central excitation spot D (not illustrated) of the excitation radiation here also sweeps over the entire surface of the conversion element 2 and at least over some of the surface of the light-passage element 40.

Disclosed is a laser activated remote phosphor (LARP) system having a radiation source that emits excitation radiation. Provided for the partial conversion of the excitation radiation is a conversion element having a phosphor. A diameter of a central excitation spot of the excitation radiation is here greater than a diameter of the conversion element.

Various embodiments provide a laser activated remote phosphor (LARP) system and a vehicle headlight having a simple and cost-effective design in terms of apparatus technology, in which used light is emitted comparatively homogeneously, i.e. there is little locational dependence of the color point on the emission side of the conversion element used in the LARP system.

According to various embodiments, a laser activated remote phosphor (LARP) system is provided with a radiation source, via which excitation radiation can be emitted. The excitation radiation is, for example, blue laser light. The system can furthermore include a conversion element, which in turn includes or at least substantially or completely consists of a phosphor.

The excitation radiation from the radiation source has an approximately symmetric intensity distribution, which can have, however, different intensity distributions in different directions parallel to the irradiation surface of the conversion element. An input-side surface region on the conversion element, in which the intensity of the excitation radiation has not yet dropped to a specific value—with respect to the central region of the excitation radiation—for example to the value 1/e of the axial central radiation, or alternatively to $1/e^2$, or alternatively to another freely selectable value, is defined below as the central region of an excitation spot of the excitation radiation. These values can be defined or set differently depending on the orientation direction parallel to the input-side surface of the conversion element, for example by beam shaping of the laser spot.

The central excitation spot is set here, for example by way of a beam-shaping optical element, such that it at least regionally radiates beyond the conversion element, i.e. at least in sections exceeds an input-side delimitation line of the conversion element, i.e. at least in sections radiates beyond the edge of the visible surface of the conversion element.

The conversion element can be used in a transmissive arrangement, that is to say where the laser excitation radiation is radiated onto one surface and the used radiation is emitted from the opposite surface of the conversion element. In a reflective arrangement, the laser excitation radiation and the used radiation are radiated onto or emitted from the same surface of the conversion element.

The excitation spot of the excitation radiation can optionally be delimited by a mechanical stop, which is disposed directly at the surface of incidence of the conversion element, or at a close distance therefrom, such that only the central excitation spot is incident on the conversion element and at least regionally radiates beyond it, i.e. at least in sections radiates beyond a delimitation line of the conversion element. The optional stop can here be designed to be round, elliptical or free form.

The central excitation spot of the excitation radiation here overshoots at least in sections a delimitation line or perimeter line of an input coupling surface of the conversion element, in particular viewed approximately in a plane, which extends approximately perpendicularly to the main emission axis of the conversion element. The delimitation line can be formed, for example, by mechanically enclosing the conversion element. The excitation radiation can here be incident, for example, approximately perpendicularly on the conversion element. The central excitation spot is thus located at least partially outside of the conversion surface of the conversion element.

This solution may have the effect that the geometry of the conversion element and the geometry of the central excitation spot are matched to each other. It has been shown that in those regions in which the central excitation spot at least in sections radiates beyond the delimitation line of the conversion element, a homogeneity of emitted used light is improved. This homogeneity can be measured as a spatial variance of the Cx or Cy color space values (CIE) from the central region of the used radiation to an exterior region of the used radiation on the emission surface of the conversion element, for example. With the apparatus or radiation method described here, it is possible to keep the respective color variance Cx or Cy low, for example in the respective value ranges between 5% and 30%. It is thus possible in a simple way to improve the blue-yellow homogeneity problem mentioned in the introductory part or even to largely minimize it.

Whereas, it is customary in the prior art for a spatial extent of the conversion element approximately perpendicular to the excitation direction to be greater than the central excitation spot and for the latter therefore to not entirely fill the irradiation surface of the conversion element. Subsequently, a larger portion of unconverted excitation radiation exits from an output coupling surface, or light-exit surface, of the conversion element in the region that is irradiated by the central excitation spot as compared to the edge region, which is irradiated by excitation radiation that is emitted by an excitation spot that is at least partially located outside of the central excitation spot. Conversely, the edge region of the conversion element emits a greater portion of converted excitation radiation as compared to the central region. In the case of the angular distribution, a similar effect is produced for the exiting spectra, i.e. for the transmitted excitation spectrum and the converted spectrum. Conventionally, unconverted excitation radiation exits here from the output coupling surface in the central region of the conversion element with a higher directionality or a lower angle divergence, owing to fewer scattering effects, while the angular distribution in the edge region is wider due to a greater number of scattering effects and a greater traveled path length of the excitation radiation in the conversion element. Similar effects also occur in the case of the converted radiation. Such a configuration thus results in the color point paths mentioned in the introductory part, i.e. a center with an excess of blue and a yellow exterior region.

It is thus provided in the case of the LARP system according to various embodiments that, in the regions in which the central excitation spot radiates beyond the delimitation line of the conversion element, surface increments or surface regions of the output coupling surface have approximately the same ratio of unconverted excitation radiation (excitation spectrum, partial transmission) to converted radiation (conversion spectrum, conversion) in these regions as compared to the central region of the conversion element. The same is true for the angular distributions of the unconverted excitation radiation and the converted radiation in these regions as compared to the central region.

This way of achieving the object furthermore has the advantage that the used light already has a comparatively high homogeneity at the output coupling surface of the conversion element and thus has a comparatively high homogeneous mix. The result is that for light mixing no further measures, or less involved measures, need to be taken in a possible optical system downstream of the LARP system as compared to a conventional system ("ease of use"). For the possible optical system, therefore additional degrees of freedom in terms of installation space, in terms of dimensions of one or more optical units and/or in terms of realization of contrasts (light/dark boundary) are attained. Furthermore, in the way in which the object is achieved in accordance with various embodiments, efficiency loss is reduced or is substantially prevented, because no blocking of undesired regions of the used light is provided, or introduction of scatter elements in a beam path of the used light is dispensed with, for improving the efficiency as compared to the conventional system.

The central excitation spot thus overshoots at least in sections an edge line of the converter element or of the provided conversion region. A form and dimension of the central excitation spot can thus be selected such that it goes beyond the conversion element, at least in sections. The dimension can here describe a geometric extent of the converting region and of the excitation spot for example perpendicular to the excitation direction. With this design, the used light is homogenized in a simple manner in terms of apparatus technology. The central excitation spot may be designed to be approximately circular, but can also have an elliptical or polygonal or free-form design. It may furthermore be provided that the central excitation spot and the conversion element are arranged to be approximately coaxial with respect to one another, which results in improved homogeneity.

In a further configuration of various embodiments, a light-passage element is provided. This light-passage element here engages in apparatus-technological manner simply around the conversion element. The light-passage element and the conversion element can here be connected. The engagement is effected for example in sections or substantially completely or completely. In various embodiments, the engagement takes place on the side of the parameter of the conversion element by way of the conversion element being engaged around its edge. As a result, the input coupling surface can then be enclosed by the light-passage element. In various embodiments, the light-passage element is designed to be circular or ring-segment-shaped, but can also be frustoconical or in free-form design. In the case of a frustoconical configuration of the light-passage element, the input-side diameter can be greater than the opposite output-side diameter.

The light-passage element can have a design that is transparent or partially transparent e.g. for the excitation radiation or for the excitation spectrum, and can alternatively or additionally be scattering. The light-passage element may consist at least substantially completely or completely of a material which for the excitation radiation is transparent or partially transparent and/or scattering.

Alternatively, it is feasible that the light-passage element consists at least substantially completely or completely of a material that is opaque or not transparent for the excitation radiation. In the light-passage element, here a through-cutout or a plurality of through-cutouts can then be provided, through which the excitation radiation can radiate. In other words, the light-passage element surrounding the conversion element is partially transparent for the exciting spectrum at least by way of channels or holes.

In a further configuration of the invention, it is feasible that the through-cutout or the through-cutouts have a filler material. The filler material can then be transparent or semitransparent and/or scattering for the excitation radiation.

The transmission or partial transmission of the excitation radiation through the light-passage element may result in it superposing the excitation radiation that was converted by the conversion element, which improves homogenization of the color impression over the site on the output coupling surface of the LARP system and over the observation viewing angle.

In a further configuration of various embodiments, the conversion element has, e.g. approximately in a plane intersecting the conversion element, which plane can extend approximately transversely with respect to the main emission direction, a shape that deviates from a circular shape. As a result, less material may be provided in the edge region of the conversion element as compared to a completely circular conversion element. In other words, the delimitation line of the conversion element, or a perimeter wall of the conversion element that engages around the input coupling surface or the output coupling surface, is designed such that fewer surface segments are deliberately provided in the perimeter region of the phosphor that emit converted excitation radiation. As a result, it is possible for deliberately less converted radiation to be emitted in the edge region of the conversion element, which in turn results in improved homogenization of the color impression over the output coupling surface of the LARP system and over the viewing angle. The conversion element can thus for instance be radially recessed in sections in the plane extending transversely with respect to the main emission direction and/or have an undulating or star-shaped delimitation line. Alternatively or additionally, it is feasible for the conversion element to have a cutout or a plurality of cutouts in the edge region. The number and/or the dimension of the cutout segments can be varied with increasing distance from the center of the conversion element or be chosen to correspond to the requirements. Alternatively or additionally, it is also feasible for the conversion element to have at least in sections a thickness that decreases toward the edge. The thickness can here decrease e.g. uniformly with increasing distance toward the center. What is feasible here is that the thickness decreases only after a specific distance from the center of the conversion element. Alternatively or additionally, it is also feasible for the conversion element to have, or for it to be made up of, a circle-segment-shaped sequence of phosphor regions which are arranged in a concentric sequence around the optical axis (here coinciding with the incidence direction of the laser radiation), i.e. in the manner of onion skin. Here, the respective layer thicknesses and/or material properties, for example doping with radiation-converting substances, of the different concentrically arranged circle segments can be varied and set in accordance with the requirements. For example, it is possible, by way of different doping, for the conversion degree of the segment rings to be set such that it decreases outwardly from the inside, i.e. for the interior circle segment rings to convert more strongly than the exterior ones. The opposite arrangement is also feasible (less converting in the interior than the exterior), as are any desired settings. It is also possible for the respective circle segment rings to be made up of different circle segment ring sections, which can likewise have different properties in the previously mentioned manner, e.g. also doping that varies in the circumferential direction. In various embodiments, a structure, or a confinement structure, which is opaque or not transparent for the excitation radiation, engages around the conversion element, or around the conversion element and the light-passage element, on the perimeter side or from the edge. The excitation radiation therefore radiates through the LARP system in a defined region. The structure can for example at least partially or substantially or completely consist of an optically opaque material, for example a metallic coating, for example aluminum oxide. The structure may completely engage around the conversion element or the light-passage element. Also feasible is that the conversion element, or the conversion element together with the light-passage element, are held in the structure.

In various embodiments, the central excitation spot covers both the conversion element and the light-passage element or the light-passage elements over the entire surface. As a result, particularly high homogeneity of the used light is achieved.

Optionally, an aperture is provided on the radiation-exit side and/or the radiation-entrance side. This aperture is for example in the form of a mask. Undesired radiation which is, for example, emitted by the structure can be caught hereby. The aperture may be arranged on the structure. An opening cross section of the aperture is preferably approximately identical to or greater than the conversion element, or, if a light-passage element is provided, than the light-passage element. The aperture can have a plate-type and/or ring-type and/or free-form design.

The output coupling surface and/or the input coupling surface for the radiation of the conversion element may be located approximately in a plane with a radiation exit surface and/or a radiation entrance surface of the light-passage element. An output coupling surface and/or input coupling surface for the radiation of the conversion element can furthermore be located approximately in a plane with a, or with a respective, front end of the confinement structure.

The conversion element, or the conversion element together with the light-passage element, can have an input coupling side and an output coupling side for the radiation, which makes it or them transmissive. It is alternatively feasible that the conversion element, or the conversion element together with the light-passage element, has a side that serves as input coupling side and as output coupling side. The conversion element, or the conversion element together with the light-passage element, is/are here arranged for example on a reflective element. This is then also referred to as a reflective LARP system.

The LARP system may be configured such that the excitation radiation is partially converted. Provided as the radiation source for the excitation radiation can be, for example, one or more laser diodes, for example in the wavelength range 405 nm to 460 nm.

The LARP system may be provided for a vehicle headlight or for example for a head-up display. It is also feasible to use the LARP system for projection applications, for example in cinema projection, but also as a light source in effect projectors, in studio illumination, in medical illumination, for medical radiation treatment, and many others.

LIST OF REFERENCE SIGNS laser activated remote phosphor system 1
conversion element 2
excitation radiation 4
input coupling surface 6
conversion radiation 8
output coupling surface 10
arrows 12
radiation intensity 14
delimitation line 15
light-passage element 16
light-entry surface
light-exit surface 20
confinement structure 22
mask 24
opening 26
line 27
dash-dot line 28
conversion element 30
outer contour 32
jags 34
light-passage element 36
light-passage element 38
through-cutouts 40

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A laser activated remote phosphor system, comprising:
a radiation source configured to emit excitation radiation;
a conversion element which has a phosphor and is able to be irradiated by the excitation radiation, wherein an input coupling surface of the conversion element has a delimitation line beyond which a central excitation spot of the excitation radiation radiates at least in sections; and
a multiplicity of through cut-outs engaged around the conversion element wherein in used light on the exit side of the laser activated remote phosphor system a ratio of an intensity distribution of yellow conversion radiation to blue, unconverted excitation radiation viewed approximately transversely with respect to the main emission axis has a color variance of less than or equal to 20%.

2. The laser activated remote phosphor system of claim 1, wherein the central excitation spot completely covers the conversion element.

3. The laser activated remote phosphor system of claim 1, wherein the multiplicity of through cut-outs is at least partially transparent and/or scattering for the excitation radiation.

4. The laser activated remote phosphor system of claim 1, wherein the central excitation spot completely covers the multiplicity of through cut-outs.

5. The laser activated remote phosphor system of claim 1, wherein the multiplicity of through cut-outs completely engages around the conversion element.

6. The laser activated remote phosphor system of claim 1, wherein the multiplicity of through cut-outs consists at least substantially completely or completely of a material that is at least partially transparent and/or scattering for the excitation radiation.

7. The laser activated remote phosphor system of claim 1, wherein the multiplicity of through cut-outs consists at least substantially completely or completely of an opaque material for the excitation radiation.

8. The laser activated remote phosphor system of claim 1, wherein the conversion element has a shape that deviates from a circular shape.

9. The laser activated remote phosphor system of claim 8, wherein the conversion element viewed approximately in a plane transversely with respect to the main emission direction has a shape that deviates from a circular shape.

10. The laser activated remote phosphor system of claim 1, wherein the conversion element has in the edge region one or more cutouts.

11. The laser activated remote phosphor system of claim 1, wherein the conversion element has a lower thickness in the edge region.

12. The laser activated remote phosphor system of claim 1, wherein a confinement structure, which is opaque for the excitation radiation, engages around the perimeter side of the conversion element, or around the conversion element together with the multiplicity of through cut-outs.

13. The laser activated remote phosphor system of claim 1, wherein an aperture is provided on the radiation exit side or the radiation entry side.

14. The laser activated remote phosphor system of claim 13, wherein the aperture is arranged on the confinement structure.

15. The laser activated remote phosphor system of claim 1, wherein the ratio viewed approximately transversely with respect to the main emission axis has a color variance of less than or equal to 10%.

16. The laser activated remote phosphor system of claim 1, wherein the ratio viewed approximately transversely with respect to the main emission axis has a color variance of less than or equal to 5%.

17. The laser activated remote phosphor system of claim 1, wherein the conversion element has, or consists of, a circle-segment-shaped sequence of phosphor regions.

18. The laser activated remote phosphor system of claim 1, wherein the conversion element, or the conversion element together with the light-passage element, is/are arranged on a reflective element, and wherein the excitation radiation irradiates a surface of the conversion element and the used light is emitted from said surface.

* * * * *